United States Patent [19]
Walpole et al.

[11] Patent Number: 5,099,910
[45] Date of Patent: Mar. 31, 1992

[54] MICROCHANNEL HEAT SINK WITH ALTERNATING FLOW DIRECTIONS

[75] Inventors: James N. Walpole, Concord; Leo J. Missaggia, Milford, both of Mass.

[73] Assignee: Massachusetts Institute of Technology, Cambridge, Mass.

[21] Appl. No.: 641,504

[22] Filed: Jan. 15, 1991

[51] Int. Cl.$^5$ .............................................. F28F 3/12
[52] U.S. Cl. .................... 165/80.4; 165/170; 361/385
[58] Field of Search ............... 165/80.3, 80.4, 185, 165/170; 361/385

[56] References Cited

U.S. PATENT DOCUMENTS

| | | | |
|---|---|---|---|
| 4,268,850 | 5/1981 | Lazarek et al. | 357/82 |
| 4,474,226 | 10/1984 | Greiner et al. | 165/1 |
| 4,561,040 | 12/1985 | Eastman et al. | 361/385 |
| 4,573,067 | 2/1986 | Tuckerman et al. | 357/82 |
| 4,628,991 | 12/1986 | Hsiao et al. | 165/80.4 |
| 4,758,926 | 7/1988 | Herrell et al. | 361/385 |
| 4,777,560 | 10/1988 | Herrell et al. | 361/384 |
| 4,860,444 | 8/1989 | Herrell et al. | 29/840 |
| 4,894,709 | 1/1990 | Phillips et al. | 357/82 |
| 4,903,640 | 2/1990 | Howard | 122/6 A |
| 4,938,280 | 7/1990 | Clark | 165/80.4 |

OTHER PUBLICATIONS

*IBM Tech. Disclosure Bulletin*, vol. 22, No. 8A 1/1980, "Two Piece Cold Plate with Corrugated Heat Transfer Surface", Bergles.

J. P. Donnelly et al.; High-power hybrid two-dimensional surface-emitting AlGaAs diode laser arrays; Laser-Diode Technology and Applications II; vol. 1219; pp. 255-263.

L. J. Missaggia et al.; Microchannel Heat Sinks for Two-Dimensional High-Power-Density Diode Laser Arrays; IEEE Journal of Quantum Electronics; vol. 25; No. 9; Sep. 1990; pp. 1988-1992.

D. Mundinger et al.; Demonstration of high-performance silicon microchannel heat exchangers for laser diode array cooling; Appl. Phys. Lett.; vol. 53; No. 12; Sep. 19, 1988; 1030-1032.

R. J. Phillips; Microchannel Heat Sinks; The Lincoln Laboratory Journal; vol. 1; No. 1; 1988 pp. 31-48.

D. Nayak et al.; A High-Performance Thermal Module for Computer Packaging; Jour. of Elec. Mat.; vol. 16; No. 5 1987; pp. 357-364.

L. Hwang et al.; A thermal Module Design for Advanced Packaging; Jour. of Elec. Mat.; vol. 16; No. 5; 1987 pp. 347-355.

T. Kishimoto et al.; Cooling Characteristics of Diamond-Shaped Interrupted Cooling fin For High-Power LSI Devices; NTT Electronics & Mechanics Tech. Labs.; Feb. 26, 1987.

S. Sasaki et al.; Optimal Structure For Microgrooved Cooling Fin For High-Power LSI Devices; Electronic Letters; vol. 22; No. 25; Dec. 4, 1986; pp. 1332-1333.

Mahalingam; Thermal Management in Semiconductor Device Packaging; Proceedings of the IEEE; vol. 73; No. 9; Sep. 1985; pp. 1396-1404.

N. Goldberg; Narrow Channel Forced Air Heat Sink; EIII; vol. CHMT-7; No. 1; Mar. 1984; pp. 154-159.

D. Tuckerman et al.; High-Performance Heat Sinking for VLSI; IEEE; vol. EDL-2; No. 5; May 1981; 126-129.

*Primary Examiner*—Allen J. Flanigan
*Attorney, Agent, or Firm*—Fish & Richardson

[57] ABSTRACT

A microchannel heat sink with coolant flowing in alternate directions in adjacent channels. The microchannel heat sink is used for cooling the electronic device making thermal contact with the surface of the heat sink. The alternate directions of the coolant flow eliminate temperature variation along the channel length caused by the heating of the coolant. This new "alternating channel flow" heat sink design achieves a nearly uniform temperature and thermal resistance on the surface of the heat sink and effectively cools the electronic device in contact.

11 Claims, 4 Drawing Sheets

THEORY
—— ACF FLOW 1
---- ACF FLOW 2

EXPERIMENT
□ CONVENTIONAL FLOW (PRIOR ART)
● ACF FLOW 1
○ ACF FLOW2

MICROCHANNEL HEAT SINK WITH ALTERNATING FLOW DIRECTIONS

BACKGROUND OF THE INVENTION

This invention relates to microchannel heat sinks for cooling electronic devices.

Microchannel heat sinks have been developed for extraction of waste heat generated by two-dimensional diode laser arrays, integrated electronic circuits, or other electro-optic devices under conditions of high heat flux density. Coolant flow in the microchannels is conventionally unidirectional; e.g., the coolant enters the heat sink through an inlet plenum at one end, and flows through parallel microchannels to an outlet plenum at the other end.

SUMMARY OF THE INVENTION

We have discovered that the performance of microchannel heat sinks can be greatly improved by providing alternating flow directions in the microchannels. For example, adjacent microchannels can have oppositely directed coolant flow.

The invention overcomes a problem of temperature rise along the channel length that we have observed in conventional microchannel heat sinks. In such heat sinks the surface temperature rises in the streamwise direction because of an approximately linear temperature rise in the coolant along the channel length. As the channels are narrowed to improve the convective heat transfer, the temperature rise of the water becomes the dominant source of thermal resistance (per unit area) which is defined as the ratio of the temperature rise at the heat sink surface above the inlet water temperature (in °C.) and the heat flux (in W/cm$^2$).

By providing alternating coolant flow directions, embodiments of the invention can achieve a nearly uniform temperature and thermal resistance at the surface of the heat sink.

In preferred embodiments, the heat sink is operated in the turbulent flow regime to reduce the width of the thermal boundary layers in the channels and thereby enhance heat transfer; an electronic device (e.g., a laser diode array, densely packed integrated circuits, or an electro-optic device) is installed on the heat sink; the heat sink is formed by cutting fins on one surface of a silicon wafer and mounting the wafer on a manifold with inlet and outlet holes aligned with the channels.

Other features and advantages of the invention will be apparent from the following description of the preferred embodiment, and from the claims.

DESCRIPTION OF THE PREFERRED EMBODIMENT

Figure 1:
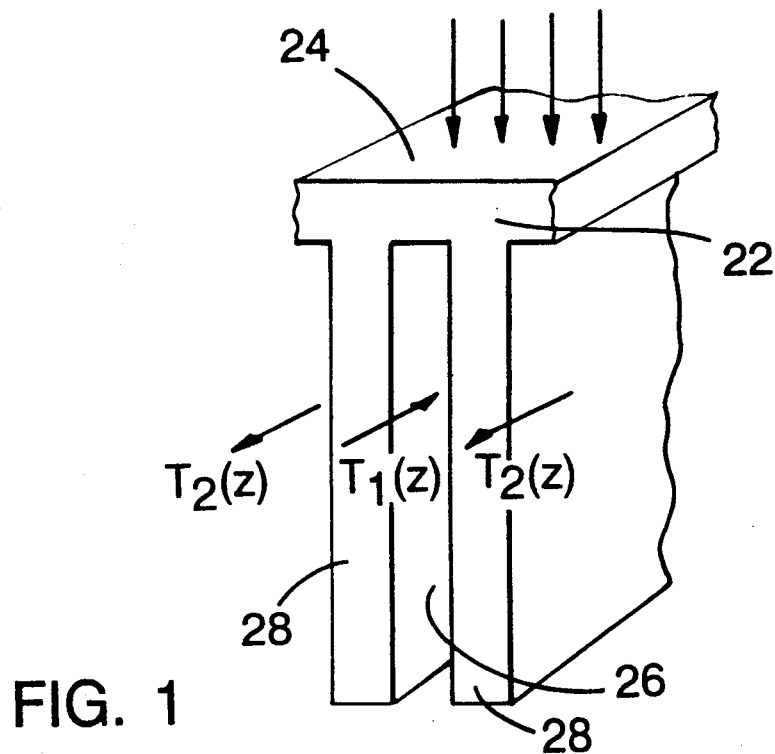
FIG. 1 is a diagrammatic, cross-sectional view taken through a portion of the microchannel heat sink of the invention.
Figure 2:
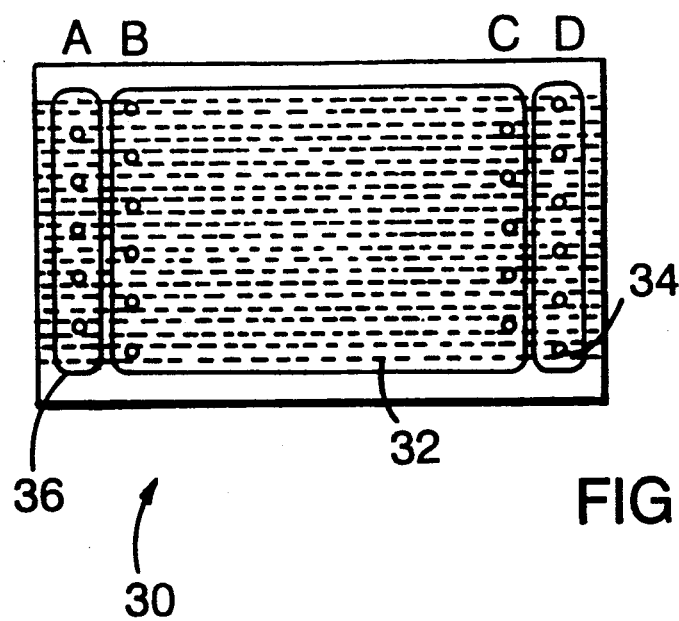
FIG. 2 is a plan view of a manifold plate used in conjunction with the heat sink.
Figure 3:
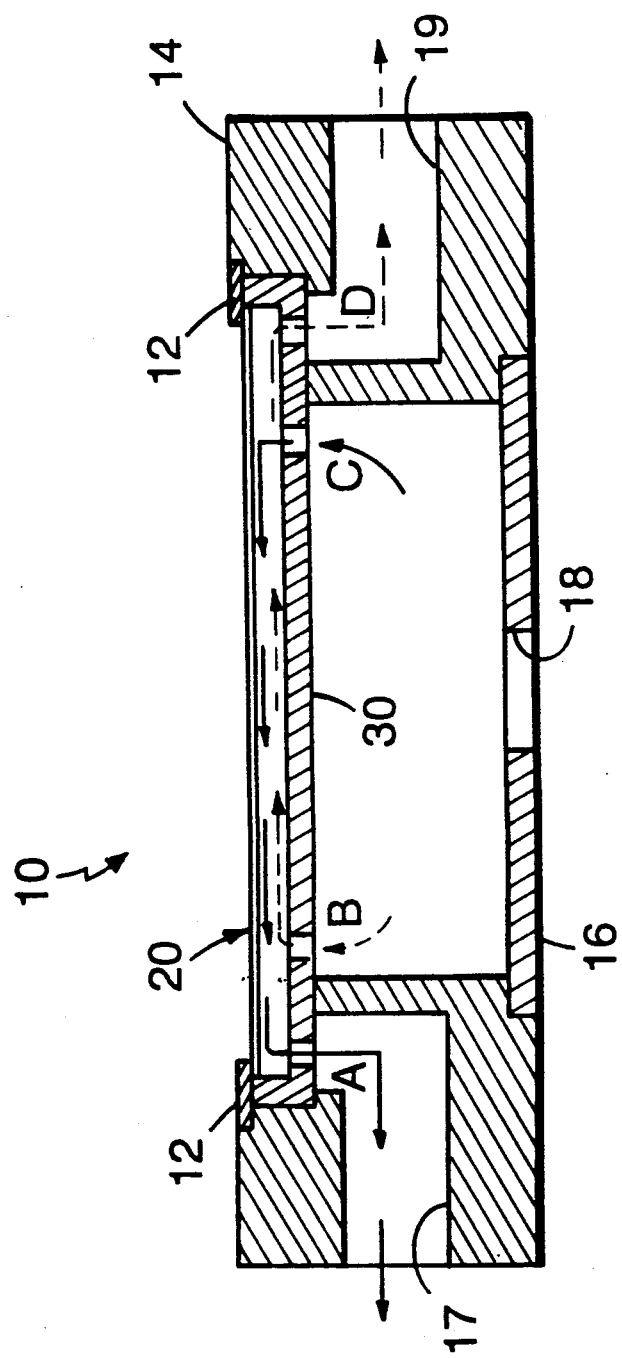
FIG. 3 is a cross-sectional view of the assembled microchannel heat sink and associated flow manifold.

The structure of the heat sink is shown in FIGs. 1, 2, and 3. FIG. 3 shows the heat sink member 20 assembled with manifold plate 30, flow manifold 14, and bottom plate 16, which serve to supply and remove coolant from the heat sink member. Top plate 12 is used to cover up the gaps between the flow manifold and the heat sink member. Coolant flows from an external source into the heat sink via inlet 18 of the bottom plate, and exits through outlets 17 and 19.

FIG. 1 shows a portion of the heat sink 20, to illustrate the alternating flow directions in adjacent microchannels. The heat sink, which is machined from silicon, consists of top portion 22, thermal contact surface 24, microchannels 26, and fins 28. The electronic device to be cooled is secured to thermal contact surface 24. Microchannels 26 and fins 28 are formed using a high-speed dicing saw. The width of portion 22 and microchannels 26 are approximately the same in order to achieve temperature uniformity on thermal contact surface 24.

Figure 4:
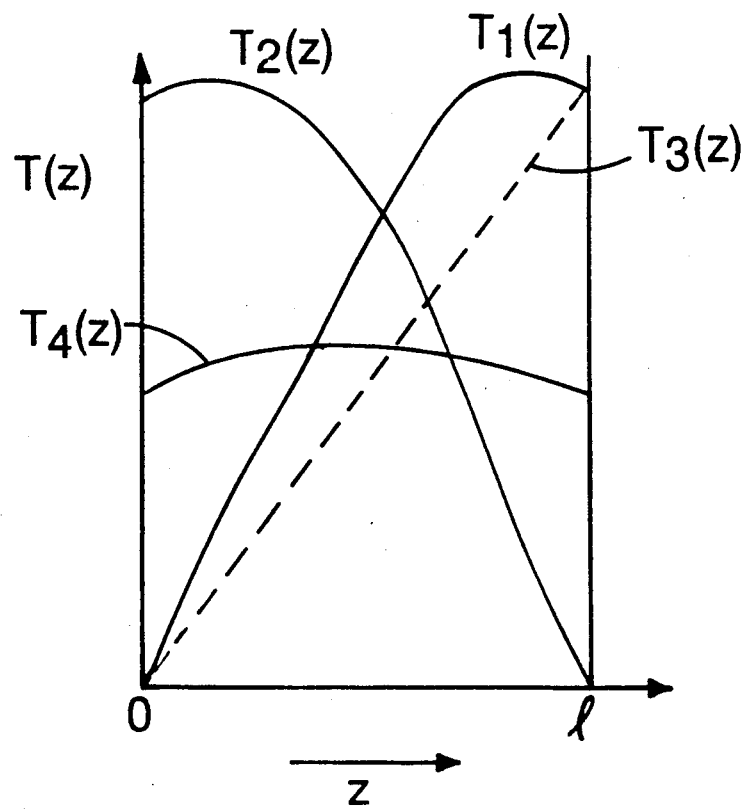
FIG. 4 is a graph of the temperature variations along two adjacent channels and the resulting variation at the thermal contact surface; also shown (in dashed lines) is the temperature variation of a prior art, unidirectional heat sink.

The channeled side of the heat sink is secured to manifold plate 30. The manifold plate has an inlet plenum 32 and outlet plenums 34, 36 to direct the flow of the coolant, see FIG. 2. The holes A, B, C, and D are aligned with the microchannels of the heat sink; the dashed lines represent the locations of the microchannels with respect to the holes in the plate. Coolant flows through inlet holes B and C, and exits through holes D and A, respectively. Hence coolant flows in alternate directions in adjacent channels FIG. 4 shows temperatures $T_1(z)$ and $T_2(z)$ (where z is along the direction of coolant flow) of the coolant in two adjacent channels with alternating flow (neglecting end effects discussed below). $T_3(z)$ is the temperature variation when one-way flow is used. $T_4(z)$ is the temperature variation which is seen at the top of the heat sink for the alternating channel flow design. $T_4(z)$ is almost uniform throughout the channel (except at the two ends) and provides a nearly uniform thermal resistance over the surface of the heat sink. The end effects are caused by the diffusion of heat at the perimeter of the heat sink into the adjacent structure (manifold structures 30, 14). Thermal insulation or heating elements can be used to overcome this heat loss.

Figure 6:
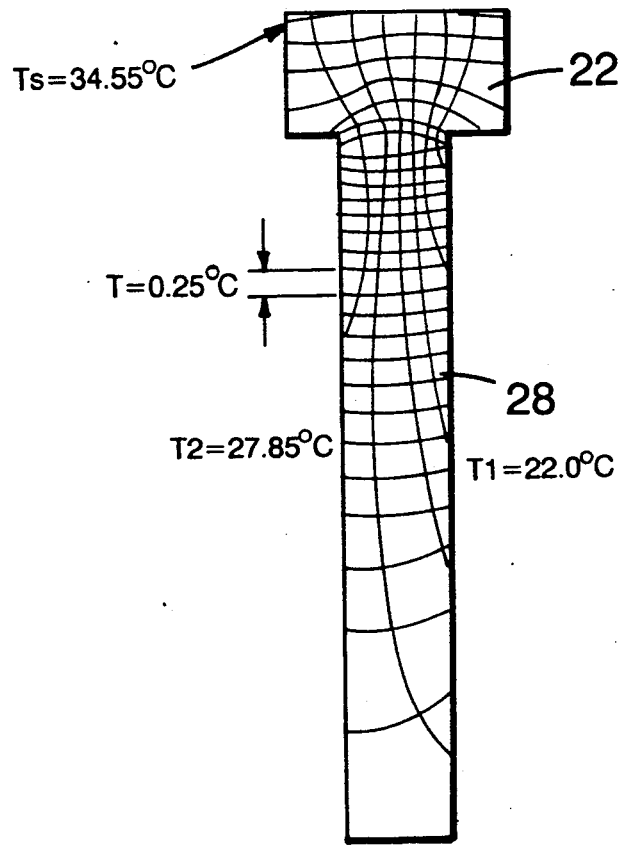
FIG. 6 shows isotherms and adiabatic lines on one portion of the microchannel heat sink.

Isotherms and adiabatic lines for one heat sink fin 28 and the adjacent portion of top portion 22 are shown in FIG. 6 (which corresponds to a position along the z axis where the difference in water temperature between adjacent channels is near maximum). The way the heat spreads in the heat sink fin and the top portion 22 makes it preferable that the width of the top portion 22 and the width of microchannel 26 be approximately the same in order to achieve temperature uniformity on the surface of the heat sink.

Figure 5:
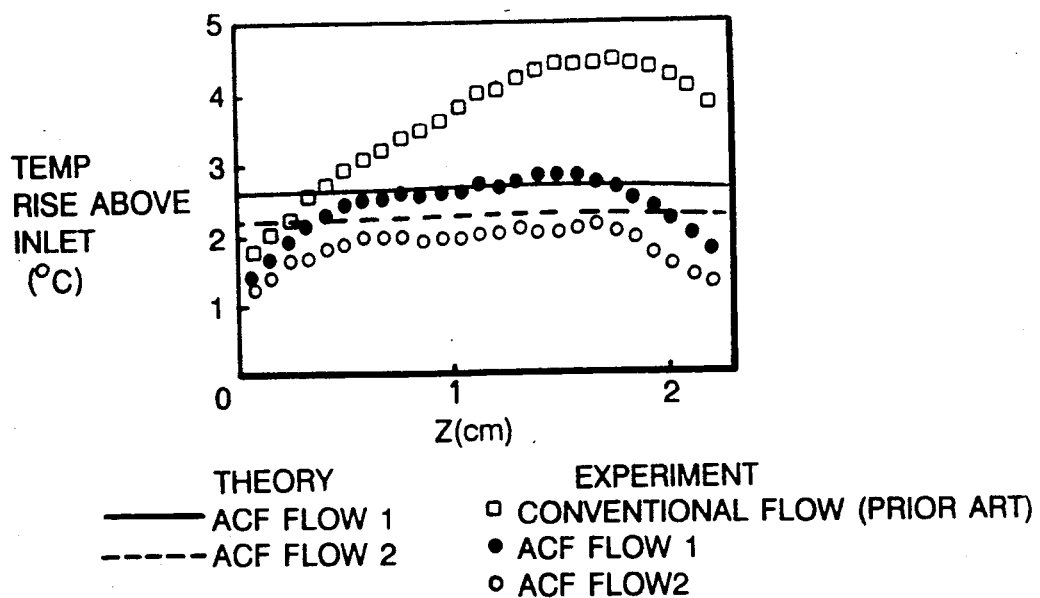
FIG. 5 is a graph comparing theoretical predictions with experimental results, including experimental results for a prior art, unidirectional heat sink.

FIG. 5 shows the experimental and theoretical temperature profiles of a 2.3-cm-long and 1-cm-wide heat sink. Data were obtained with the heat sink operating at two different fluid flow conditions with an applied heat load of 18.6 W/cm$^2$ and an initial coolant temperature of 22° C. For case 1, the flow rate of the coolant was 15.8 cm$^3$/sec with a pressure drop across the heat sink of 73 kPa. For case 2, the flow rate of the coolant was 28 cm$^3$/sec with a pressure drop of 248 kPa. The temperature profile of a conventional uni-directional flow heat sink is also plotted.

A 10×10 cm$^2$ heat sink with 10-cm-long channels was theoretically modeled by means of a finite-difference technique to obtain the heat sink's temperature profile. The heat flux was modeled at 100 W/cm$^2$, and the flow rate was 44.4 cm$^3$/sec, in order to model operation in the turbulent flow regime. The maximum temperature differential that occurred between the inlet/outlet and the center of the heat sink was 0.85° C. The spatial variation of the thermal resistance of the heat sink was predicted to be less than 0.0085° C. cm$^2$/W.

OTHER EMBODIMENTS

Figure 7:
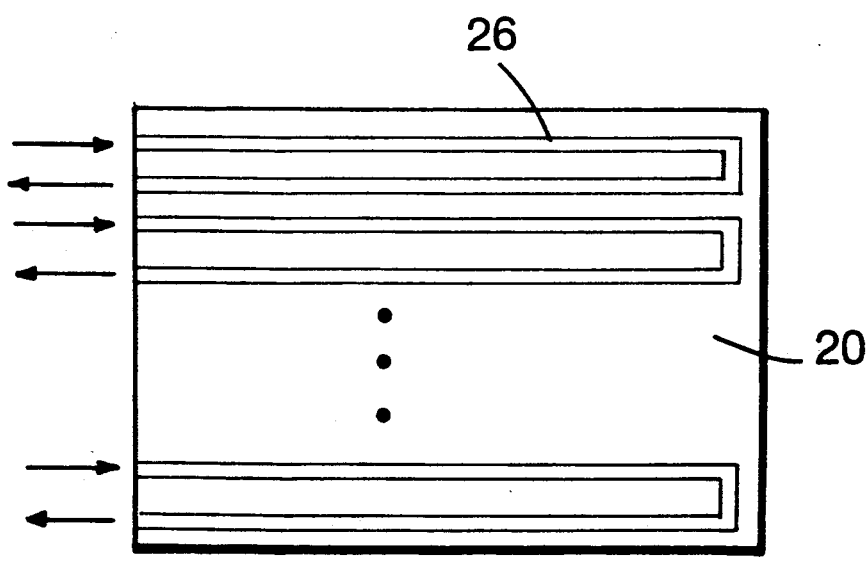
FIG. 7 is a plan view of an alternative embodiment, in which adjacent channels are connected at one end of the heat sink member.

Other embodiments of the invention are within the following claims. For example, as shown diagrammatically in FIG. 7, adjacent microchannels could be connected at one end of the heat sink member, and the inlets and outlets all located at the other end, to achieve the alternating flow directions. Reduced pressure drop could be achieved by forming the inlet and outlet holes in the manifold plate as slots rather than round holes; this could achieve higher flow velocities, ensuring turbulent flow, thus improving heat transfer convection.

The invention can be applied to cooling a variety of electronic devices, e.g., two-dimensional diode laser arrays, integrated electronic circuits, or other electro-optic devices under conditions of high heat flux density.

Other materials can be used for the microchannel heat sink. For example, a copper-tungsten composite such as Thermcon ® or a ceramic such as beryllium oxide could be used.

The grooves in the heat sink member could be formed by etching rather than machining.

We claim:

1. Apparatus for cooling an electronic device, comprising
   a heat sink member with a surface for making thermal contact with said electronic device,
   said member having a plurality of generally parallel microchannels for carrying coolant fluid,
   a first group of said microchannels for carrying coolant fluid in one direction,
   a second group of said microchannels for carrying coolant fluid in the opposite direction,
   a first group of inlets for supplying coolant fluid to said first group of microchannels,
   a second group of inlets for supplying coolant fluid to said second group of microchannels, said second group of inlets being on the opposite side of said member from said first group of inlets,
   a first group of outlets for withdrawing coolant fluid from said first group of microchannels, and
   a second group of outlets for withdrawing coolant fluid from said second group of microchannels, said second group of outlets being on the opposite side of said member from said first group of outlets,
   microchannels from said first and second group being positioned generally alternately across the width of said member so that the coolant flow alternates direction across said member.

2. A fluid-cooled electronic apparatus, comprising an electronic device under conditions of high heat flux density,
   a heat sink member with a surface for making thermal contact with said electronic device,
   said member having a plurality of generally parallel microchannels for carrying coolant fluid.
   a first group of said microchannels for carrying coolant fluid in one direction,
   a second group of said microchannels for carrying coolant fluid in the opposite direction,
   a first group of inlets for supplying coolant fluid to said first group of microchannels,
   a second group of inlets for supplying coolant fluid to said second group of microchannels, said second group of inlets being on the opposite side of said member from said first group of inlets,
   a first group of outlets for withdrawing coolant fluid from said first group of microchannels, and
   a second group of outlets for withdrawing coolant fluid from said second group of microchannels, said second group of outlets being on the opposite side of said member from said first group of outlets,
   microchannels from said first and second group being positioned generally alternately across the width of said member so that the coolant flow alternates direction across said member.

3. The apparatus of claim 1 or 2 wherein said heat sink member comprises grooves cut on one surface to form fins extending from a top portion, and wherein said inlets and outlets comprise holes drilled in a manifold plate and aligned with said grooves.

4. The apparatus of claim 3 wherein said manifold plate comprises one or more inlet plenums and one or more outlet plenums, and wherein said first and second inlets lead to said plenum or plenums, and said first and second outlets lead to said outlet plenum or plenums.

5. The apparatus of claim 1 or 2 wherein said electronic device that needs to be operated at a uniform temperature is mounted on a substrate, and said heat sink member is in thermal contact with said substrate.

6. The apparatus of claim 1 or 2 wherein said heat sink member is made from a crystalline wafer material.

7. The apparatus of claim 1 or 2 wherein said heat sink member is made from a metallic material.

8. The apparatus of claim 6 wherein said crystalline wafer material is silicon.

9. The apparatus of claim 8 wherein the microchannels of said member are grooves machined into one side of said member, so that said member comprises a top portion, fins extending from the top portion, and microchannels between the fins.

10. The apparatus of claim 9 wherein the widths of said microchannels are approximately the same as the thickness of the top portion.

11. Apparatus for cooling an electronic device, comprising
    a heat sink member with a surface for making thermal contact with said electronic device,
    said member having a plurality of generally parallel microchannels for carrying coolant fluid,
    a first group of said microchannels for carrying coolant fluid in one direction,
    a second group of said microchannels for carrying coolant fluid in the opposite direction,
    pairs of adjacent first and second microchannels connected at one side of said member so that coolant fluid travelling through a first microchannel is directed into a second microchannel, a group of inlets for supplying coolant fluid to said first group of microchannels, and a group of outlets for withdrawing coolant fluid from said second group of microchannels, said group of outlets being on the same side of said member as said group of inlets, both said group of inlets and outlets being on the opposite side of said member from said microchannel connections, microchannels from said first and second group being positioned generally alternately across the width of said member so that the coolant flow alternates flow alternates direction across said member.

* * * * *

UNITED STATES PATENT AND TRADEMARK OFFICE
CERTIFICATE OF CORRECTION

PATENT NO. : 5,099,910

DATED : March 31, 1992

INVENTOR(S) : James N. Walpole, Leo J. Missaggia

It is certified that error appears in the above-identified patent and that said Letters Patent is hereby corrected as shown below:

```
Col. 1, after the Title and before the Background of the
Invention, insert the following:  --This invention was made
with government support under Contract No. F19628-90-C-0002
by Department of the Air Force.  The government has certain
rights in the invention.--
```

Signed and Sealed this

Seventh Day of September, 1993

Attest:

BRUCE LEHMAN

Attesting Officer      Commissioner of Patents and Trademarks